United States Patent
Du et al.

(10) Patent No.: US 11,227,839 B2
(45) Date of Patent: Jan. 18, 2022

(54) DISPLAY SUBSTRATE MOTHERBOARD AND METHOD FOR MANUFACTURING THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lili Du, Beijing (CN); Yue Long, Beijing (CN); Hongjun Zhou, Beijing (CN); Erlong Song, Beijing (CN); Chao Zeng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 5 days.

(21) Appl. No.: 16/649,787

(22) PCT Filed: Aug. 30, 2019

(86) PCT No.: PCT/CN2019/103715
§ 371 (c)(1),
(2) Date: Mar. 23, 2020

(87) PCT Pub. No.: WO2020/088082
PCT Pub. Date: May 7, 2020

(65) Prior Publication Data
US 2021/0074649 A1    Mar. 11, 2021

(30) Foreign Application Priority Data
Oct. 30, 2018    (CN) .......................... 201811279971.9

(51) Int. Cl.
*H01L 23/544*    (2006.01)
*H01L 27/12*    (2006.01)
*H01L 51/56*    (2006.01)

(52) U.S. Cl.
CPC ........ *H01L 23/544* (2013.01); *H01L 27/1262* (2013.01); *H01L 51/56* (2013.01)

(58) Field of Classification Search
None
See application file for complete search history.

(56) References Cited

U.S. PATENT DOCUMENTS

2007/0220742 A1    9/2007    Lo et al.
2013/0265727 A1    10/2013   Segawa
(Continued)

FOREIGN PATENT DOCUMENTS

CN    103081574 A    5/2013
CN    103605263 A    2/2014
(Continued)

OTHER PUBLICATIONS

Written Opinion and International Search issued in corresponding International application No. PCT/CN2019/103715 dated Nov. 28, 2019 (with English translation).

*Primary Examiner* — J. E. Schoenholtz
(74) *Attorney, Agent, or Firm* — Muncy, Geissler, Olds & Lowe, P.C.

(57) ABSTRACT

The disclosure relates to the field of display technology. A display substrate motherboard and a method for manufacturing the same are disclosed. In the technical solution provided by the embodiments of the disclosure, by providing via holes formed in the film, instead of small area island-like film patterns, as stitch marks of the display (Continued)

substrate motherboard, a possibility of stitch mark peeling is reduced, thereby further ensuring a reliability and yield of product.

19 Claims, 6 Drawing Sheets

(56) References Cited

U.S. PATENT DOCUMENTS

| | | | |
|---|---|---|---|
| 2015/0331310 A1 | 11/2015 | Wei et al. | |
| 2019/0043898 A1 | 2/2019 | Wang et al. | |
| 2019/0088909 A1* | 3/2019 | Cheon | H01L 21/67092 |
| 2019/0172790 A1* | 6/2019 | Kim | G06F 3/044 |

FOREIGN PATENT DOCUMENTS

| | | |
|---|---|---|
| CN | 103777364 A | 5/2014 |
| CN | 103995433 A | 8/2014 |
| CN | 104330912 A | 2/2015 |
| CN | 104735912 A | 6/2015 |
| CN | 105957867 A | 9/2016 |
| JP | H116764 A | 1/1999 |
| JP | 5893967 B2 | 3/2016 |
| KR | 20150078180 A | 7/2015 |

\* cited by examiner

DISPLAY SUBSTRATE MOTHERBOARD AND METHOD FOR MANUFACTURING THE SAME

CROSS-REFERENCE TO RELATED APPLICATIONS

This application is a U.S. national phase application of a PCT Application No. PCT/CN2019/103715 filed on Aug. 30, 2019, which claims a priority to Chinese Patent Application No. 201811279971.9 filed in China on Oct. 30, 2018, the disclosures of which are incorporated herein in their entirety by reference.

TECHNICAL FIELD

The present disclosure relates to the field of display technology, in particular to a display substrate motherboard and a method for manufacturing the same.

BACKGROUND

In a display substrate production line, a plurality of display substrates are manufactured on one display substrate motherboard, that is, a plurality of display panel regions are included on one substrate, and each display panel region is provided with all functional film patterns of a display substrate. After all the display substrates are manufactured, the display substrate motherboard is sliced into multiple independent display substrates by using a slicing process. During the manufacturing process performed on the display substrate motherboard, some stitch marks need to be manufactured on periphery of the display panel region for purposes such as alignment and obtaining an exposure offset. A conventional stitch mark is a film pattern having a small area, which is extremely easy to peel off, and is washed to the display panel region of the substrate, thereby affecting performance of a product, and even causing the product to malfunction.

SUMMARY

In a first aspect, a method for manufacturing a display substrate motherboard is provided in an embodiment of the present disclosure. The display substrate motherboard includes a substrate, the substrate includes at least two display panel regions, and a mark area is provided on periphery of each of the display panel regions. The method includes: forming a first film in the mark area; and performing a patterning process on the first film to form a plurality of stitch marks. The plurality of stitch marks are via holes formed in the first film.

According to some possible embodiments of the present disclosure, the method further includes: forming a second film in each of the display panel regions of the substrate; and performing a patterning process on the second film to form a pattern of the second film, where the forming the first film in the mark area and forming the second film in each of the display panel regions of the substrate includes: forming the first film and the second film simultaneously in one film forming process by using a same material.

According to some possible embodiments of the present disclosure, the performing the patterning process on the first film and the second film includes: sequentially patterning second films in all the display panel regions and first films in corresponding mark areas by using a mask, where the second film in each of the display panel regions and the first film in the corresponding mark area are patterned simultaneously in one patterning process by using the mask, to form the pattern of the second film and the plurality of stitch marks on the first film; where the plurality of formed stitch marks include: at least one first stitch mark on one side of the display panel region and at least one second stitch mark on an opposite side of the display panel region, a mark area between two adjacent display panel regions is provided with the first stitch mark and the second stitch mark, so as to obtain an exposure offset between patterning processes performed on the second films of the two adjacent display panel regions based on an offset relative to a set distance between the first stitch mark and the second stitch mark corresponding in position and in the mark area between the two adjacent display panel regions.

According to some possible embodiments of the present disclosure, the display substrate motherboard is an organic electroluminescence display substrate motherboard; the performing the patterning process on the second film to form the pattern of the second film includes: patterning the second film to form a planarization layer or a pixel definition layer of the organic electroluminescence display substrate motherboard.

According to some possible embodiments of the present disclosure, the display substrate motherboard is a liquid crystal display substrate motherboard; the performing the patterning process on the second film to form the pattern of the second film includes: patterning the second film to form a planarization layer of the liquid crystal display substrate mother board.

According to some possible embodiments of the present disclosure, the first film and the second film are made of a photoresist.

According to some possible embodiments of the present disclosure, the performing the patterning process on the second film to form the pattern of the second film includes: when the second film in at least one display panel region of the substrate is to be patterned, aligning a mask with the display panel region by using the stitch marks, and patterning the second film by using the mask.

In a second aspect, a display substrate motherboard is provided in an embodiment of the present disclosure, including: a substrate including at least two display panel regions, where a mark area is provided on periphery of each of the display panel regions; and a first film in the mark area, where the first film includes a plurality of stitch marks, and the plurality of stitch marks are via holes formed in the first film.

According to some possible embodiments of the present disclosure, the display substrate motherboard further includes: a second film disposed on the substrate, where the second film is in each of the display panel regions.

According to some possible embodiments of the present disclosure, the first film and the second film are a same film.

According to some possible embodiments of the present disclosure, the plurality of stitch marks includes at least one first stitch mark on one side of each of the display panel regions and at least one second stitch mark on the opposite side of each of the display panel regions, the first stitch mark and the second stitch mark are provided between two adjacent display panel regions, so as to obtain an exposure offset between patterning processes performed on the second films of the two adjacent display panel regions according to an offset relative to a set distance between the first stitch mark and the second stitch mark corresponding in position and between the two adjacent display panel regions.

According to some possible embodiments of the present disclosure, orthographic projection lines, on one side of the substrate, of the first stitch mark and the second stitch mark corresponding in position on periphery of the display panel regions at least partially overlap, and a first connection line of centers of the first stitch mark and the second stitch mark corresponding in position extends substantially along a first direction; and the substrate includes two display panel regions adjacent in the first direction, a second connection line of centers of the two display panel regions is parallel to the first connection line, a distance between the centers of the two display panel regions is substantially equal to a distance between centers of the first stitch mark and the second stitch mark corresponding in position and on opposite sides of a display panel region, and the set distance is zero.

According to some possible embodiments of the present disclosure, the first stitch mark and the second stitch mark corresponding in position and on opposite sides of one display panel region are substantially symmetrically distributed with respect to a central axis of the display panel region that is perpendicular to the first connection line.

According to some possible embodiments of the present disclosure, a shape and an aperture size of the first stitch mark are substantially the same as a shape and an aperture size of the second stitch mark.

According to some possible embodiments of the present disclosure, the substrate includes at least four display panel regions, and the at least four display panel regions are distributed substantially in matrix.

According to some possible embodiments of the present disclosure, the display substrate motherboard is an organic electroluminescence display substrate motherboard; and the second film is a planarization layer or a pixel definition layer of the organic electroluminescence display substrate motherboard.

According to some possible embodiments of the present disclosure, the display substrate motherboard is a liquid crystal display substrate motherboard; and the second film is a planarization layer of the liquid crystal display substrate motherboard.

According to some possible embodiments of the present disclosure, the stitch marks are regular-shaped via holes.

According to some possible embodiments of the present disclosure, the via hole includes at least one of a rectangular hole, a cross-shaped hole, or a triangular hole.

According to some possible embodiments of the present disclosure, the stitch marks are irregular-shaped via holes.

In a third aspect, a method for obtaining the exposure offset in a process of manufacturing the display substrate motherboard as described in the first aspect is provided in an embodiment of the present disclosure, including: obtaining the exposure offset between patterning processes performed on the second films of the two adjacent display panel regions according to the offset relative to the set distance between the first stitch mark and the second stitch mark corresponding in position and in the mark area between the two adjacent display panel regions.

BRIEF DESCRIPTION OF THE DRAWINGS

In order to illustrate the technical solutions of the embodiments of the present disclosure or in the related art in a clearer manner, the drawings desired for the descriptions of the present disclosure will be introduced hereinafter briefly. Obviously, the following drawings merely relate to some embodiments of the present disclosure, and based on these drawings, a person skilled in the art may obtain other drawings without any creative effort.

DETAILED DESCRIPTION

In a display substrate production line, a plurality of display substrates are manufactured on one display substrate motherboard, that is, a plurality of display panel regions are included on one substrate, and each display panel region is provided with all functional film patterns of the display substrate. After all the display substrates are manufactured, they are sliced into a plurality of independent display substrates by using a slicing process. During a process for manufacturing the display substrate motherboard, some stitch marks need to be manufactured on periphery of the display panel region for purposes such as alignment and obtaining an exposure offset. A stitch mark in the related art is a film pattern having a small area, and the stitch mark can be of a cross shape, an annular shape, a square shape, or the like. The stitch mark having the small area is extremely easy to peel off, and is washed to the display panel region of the substrate, which affects performance of a product, and even causes the product to malfunction.

Specifically, in a production process of a small-sized display substrate, a plurality of display substrates are manufactured on one substrate, and after the manufacture is completed, the substrate is sliced into multiple independent display substrates by using a slicing process. Since a size of a mask is smaller than that of the substrate, multiple exposures are required for one substrate. Each exposure with the mask is called a shot. Stitch marks are used to determine the exposure offset between two shots on a same substrate. A distribution of the stitch marks on the substrate/mask and an exposure relationship between shots are described as follows.

Figure 1:
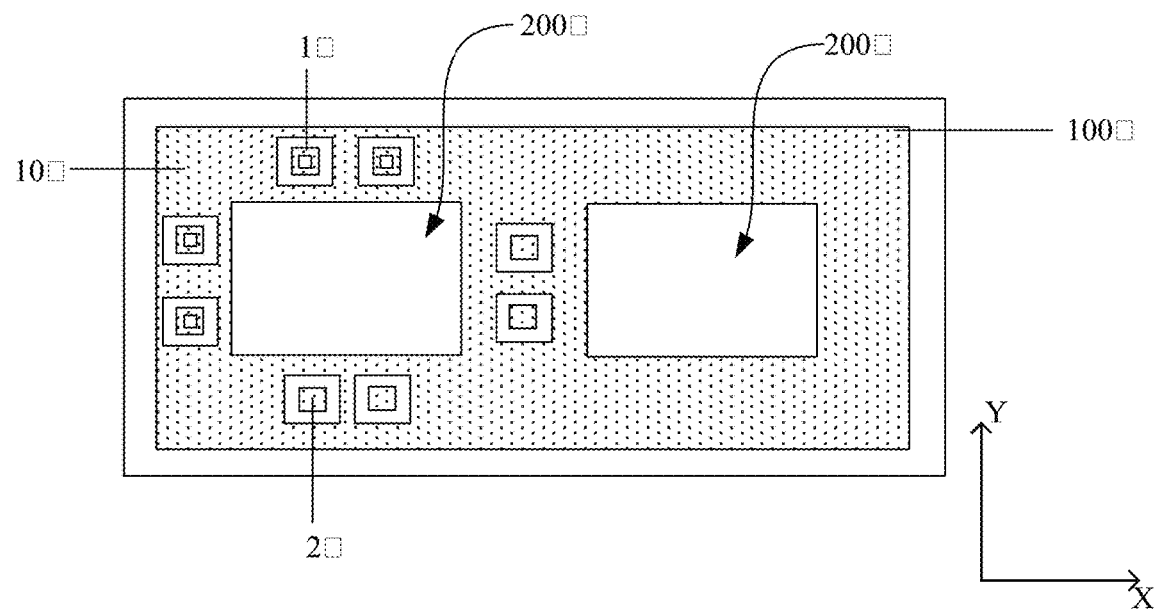
FIG. 1 and FIG. 2 show a process for manufacturing, on a substrate, stitch marks for obtaining an exposure offset between two adjacent display panel regions in the related art.
Figure 2:
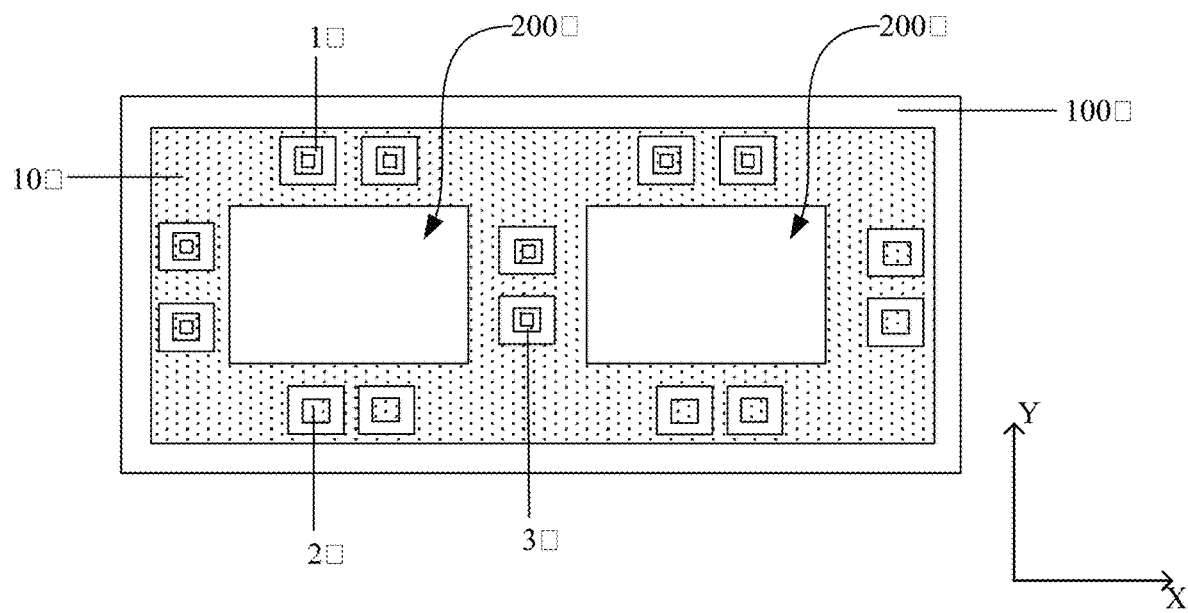

Six groups of stitch marks are distributed on periphery of the mask. As shown in FIG. 1 and FIG. 2, first stitch marks 1' having a large annular shape as shown on the upper left part of FIG. 1 are formed on a planarization layer/pixel definition layer 10' on periphery of a display panel region 200' (each display panel region 200' is used to form one display substrate) of a substrate 100' by a shot using the stitch marks on an upper frame and a left frame of the mask, and second stitch marks 2' having a small square shape as shown on the lower left part of FIG. 1 are formed on the planarization layer/pixel definition layer 10' on periphery of the display panel region 200' of the substrate 100' by a shot using the stitch marks on a lower frame and a right frame of the mask. The two shots overlap, such that a first stitch mark 1' and a second stitch mark 2' corresponding in position and located between two adjacent display panel regions 200' are combined into a third stitch mark 3' having a small annular shape, as shown in FIG. 3.

Figure 3:
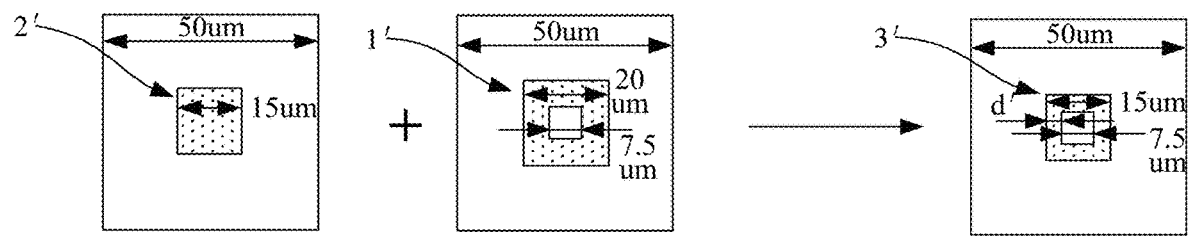
FIG. 3 shows a principle of forming the stitch marks between the two adjacent display panel regions in FIG. 2.

A specific principle of obtaining the offset between two shots is: as shown in FIG. 3, on the planarization layer/pixel definition layer 10' between the two adjacent display panel regions 200', a former shot can give rise to the second stitch marks 2' having the small square shape (for example, 15 um) as shown in FIG. 3, and a latter shot can give rise to the first stitch marks 1' having the large annular shape (for example, an inner diameter: 7.5 um, an outer diameter: 20 um) as shown in FIG. 3. When the small square shape corresponds to the large annular shape in position, a small annular shape (for example, an inner diameter: 7.5 um, an outer diameter: 15 um) is finally formed. The offset between the two shots may be determined by measuring a horizontal aperture size d' of the small annular shape. When the offset between the two shots is zero, d=15−7.5=7.5 um.

Figure 4:
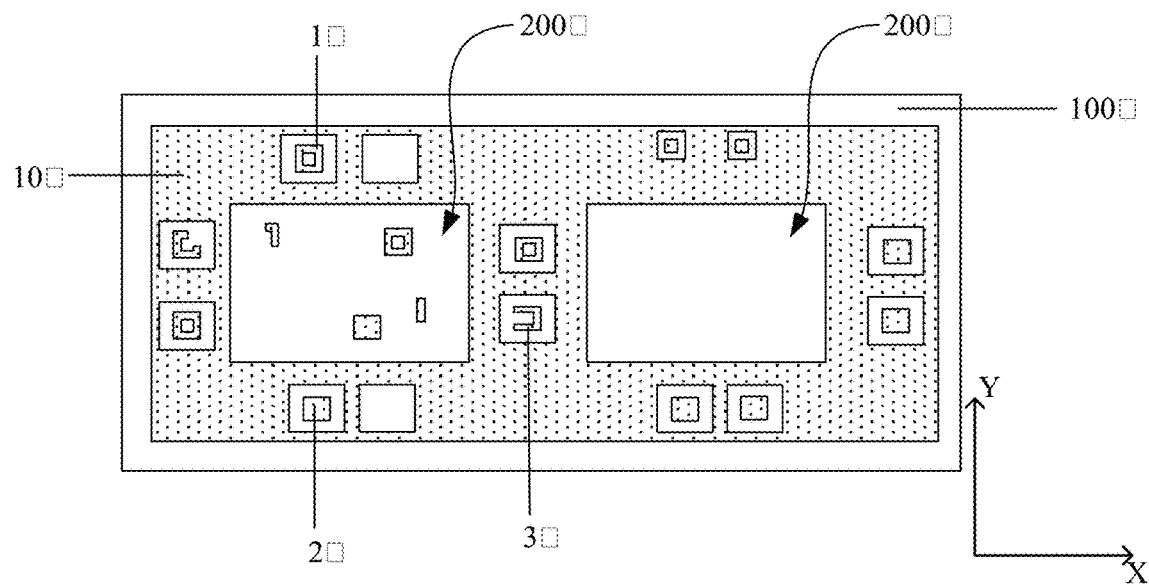
FIG. 4 is a schematic diagram illustrating that the stitch marks for obtaining the exposure offset between the two adjacent display panel regions on the substrate in the related art peel off.

However, due to material of the planarization layer/pixel definition layer, the small-area island-like stitch marks (the annular shape, the small square shape) tend to peel off. After peeling off, the island-like stitch marks are washed by a washing liquid to a backplane circuit or a light-emitting pixel region, which impacts light emitting and product yield, as shown in FIG. 4.

In order to solve the above technical problems, a method for manufacturing a display substrate motherboard is provided, the display substrate motherboard includes a substrate, the substrate includes at least two display panel regions, and a mark area is provided on periphery of each of the display panel regions. The method includes: forming a first film in the mark area of the substrate; and performing a patterning process on the first film to form a plurality of stitch marks. The plurality of stitch marks are via holes formed in the first film.

The plurality of stitch marks of the display substrate motherboard manufactured by using the above method are via holes formed in the film, instead of the small area island-like film patterns, thereby eliminating a possibility of the stitch mark peeling off, and further ensuring a reliability and yield of the product.

Correspondingly, a display substrate motherboard manufactured by using the method as described above is further provided in the present disclosure, the display substrate motherboard includes the first film in the mark area, the first film includes a plurality of stitch marks on the substrate, and the stitch marks are via holes formed in the first film.

Specific implementations of the present disclosure will be described in further detail below with reference to the drawings and embodiments. The following embodiments are used to illustrate the present disclosure, but not to limit the scope of the present disclosure.

Due to a large size of the display substrate motherboard, and a relatively small size, which is limited by exposure accuracy and cost, of the mask used for exposing the film on the display substrate motherboard, multiple exposure processes using a mask are required to be performed to complete the manufacture of the same function film pattern on multiple display panel regions of a display substrate motherboard. Taking a liquid crystal display substrate motherboard as an example, the same functional film pattern includes pixel electrodes, gate electrodes, source electrodes, or drain electrodes of thin film transistors of each display panel region.

In order to obtain an offset between two successive shots on two adjacent display panel regions, stitch marks are manufactured on periphery of the display panel regions, and the offset between two shots is obtained by using the stitch marks.

In this embodiment, the technical solution of the present disclosure is specifically introduced by taking a case in which one mask is used to expose the film of only one display panel region at a time for example. It is only exemplary, and the technical solution of the present disclosure is also applicable to the case where one mask is used to expose films of at least two adjacent display panel regions at a time. In this case, the at least two adjacent display panel regions may be regarded as a larger display panel region, the technical solution is the same as or similar to the technical solution in the case of exposing the film of only one display panel region at a time by using one mask, and a repeated description thereof is omitted.

It should be noted that the two successive shots in this embodiment refers to two exposure processes of manufacturing the same functional film pattern in the two adjacent display panel regions.

In the following, performing a patterning process on the display panel region refers to performing the patterning process on the film in the display panel region. The patterning process includes an exposure process performed on the film in the display panel region by using a mask.

Figure 5:
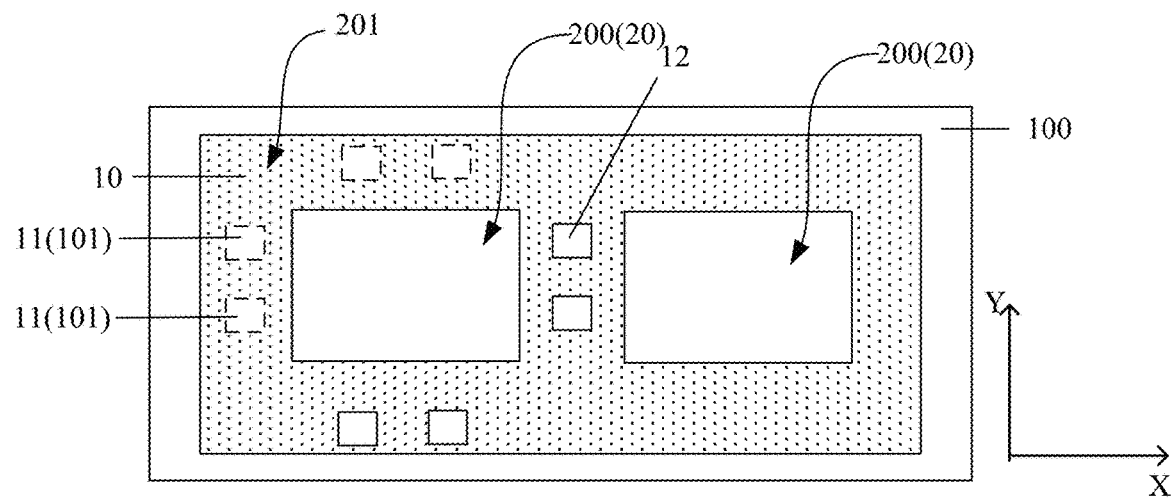
FIG. 5 and FIG. 7 show a process for manufacturing, on a substrate, stitch marks for obtaining an exposure offset between two adjacent display panel regions according to embodiments of the present disclosure.
Figure 7:
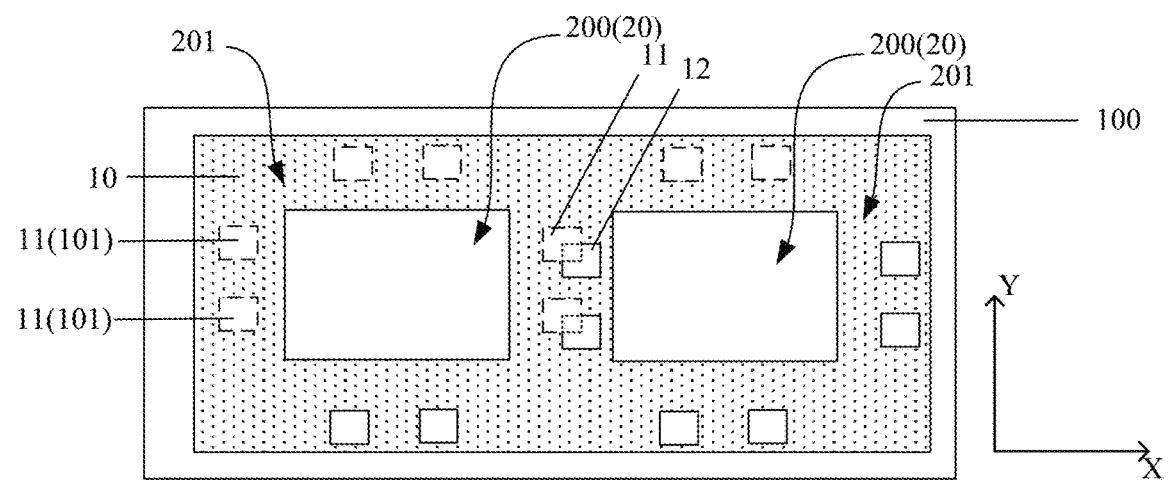

As shown in FIG. 5 and FIG. 7, the display substrate motherboard in the embodiment includes a substrate 100. The substrate 100 includes at least two display panel regions 200. A mark area 201 is provided on periphery of each of the display panel regions 200.

The method for manufacturing the display substrate motherboard in the embodiment includes: forming a first film 10 in the mark area 201, and performing a patterning process on the first film 10 to form a plurality of stitch marks, the plurality of stitch marks are via holes 101 formed in the first film 10; forming a second film 20 in each of the display panel regions 200 and performing a patterning process on the second film 20 to form a pattern of the second film 20.

The forming the first film 10 in the mark area 201 and forming the second film 20 in the display panel region 200 includes: forming the first film 10 and the second film 20 simultaneously in one film forming process by using a same material.

That is, the first film 10 and the second film 20 are a same film, so as to simplify the manufacturing process and reduce costs.

Further, the first film 10 and the second film 20 are made of a photoresist, and the via holes 101 (stitch marks) in the first film 10 and the pattern of the second film 20 may be formed by only using an exposure process, which further simplifies the manufacturing process.

The performing the patterning process on the first film 10 and performing the patterning process on the second film 20 includes: sequentially patterning second films 20 in all the display panel regions 200 and first films 10 in corresponding mark areas 201 by using a mask, where the second film 20 in each of the display panel regions 200 and the first film 10 in the corresponding mark area 201 are patterned simultaneously in one patterning process by using the mask, to form the pattern of the second film 20 and the plurality of stitch marks on the first film 10.

The stitch marks formed in the above steps includes: at least one first stitch mark 11 on one side of the display panel region 200 and at least one second stitch mark 12 on the opposite side of the display panel region 200, the first stitch mark 11 and the second stitch mark 12 are provided between two adjacent display panel regions 200, so as to obtain an exposure offset between patterning processes performed on the second films of two adjacent display panel regions 200 according to an offset relative to a set distance between the first stitch mark 11 and the second stitch mark 12 corresponding in position and located between the two adjacent display panel regions 200.

The exposure offset between patterning processes of two adjacent display panel regions is obtained by using the stitch marks corresponding in position and located between the two adjacent display panel regions according to the above method, since the stitch marks are the via holes in the film, instead of the small area island-like film patterns, a possibility of the stitch mark peeling off is eliminated, and the reliability and the yield of the product is further ensured.

In this embodiment, a process of obtaining the exposure offset of a process of manufacturing the display substrate motherboard includes: obtaining the exposure offset between patterning processes performed on the second films of two adjacent display panel regions according to the offset relative to the set distance between the first stitch mark and the second stitch mark corresponding in position and located in the mark area between the two adjacent display panel regions.

In the technical solutions provided in the embodiments of the present disclosure, a specific principle of obtaining the offset between two successive exposure processes of two adjacent display panel regions 200 is: since the display panel region 200 and the stitch marks on periphery of the display panel region 200 are manufactured by using the same mask, the exposure offset between patterning processes of the two adjacent display panel regions 200 is equal to the exposure offset between patterning processes of forming the stitch marks corresponding in position and on periphery of the two adjacent display panel regions 200. Therefore, the exposure offset between patterning processes performed on the second films 20 of two adjacent display panel regions 200 can be obtained by using the offset (i.e., the exposure offset) relative to a set distance between the stitch marks corresponding in position and on periphery of the two adjacent display panel regions 200.

In addition, since the stitch marks on periphery of all the display panel regions 200 are manufactured by using the same mask, the stitch marks are distributed on periphery of all the display panel regions 200 according to the same rule, and a set distance between the first stitch mark 11 and the second stitch mark 12 located between two adjacent display panel regions 200 may be set by setting a distance between the two adjacent display panel regions 200. When there is an offset between the shots of two adjacent display panel regions 200, there is also an offset in the stitch marks formed by the shots on periphery of the two display panel regions 200. Therefore, the exposure offset between patterning processes performed on the second films 20 of two adjacent display panel regions 200 may be obtained according to the offset (i.e., the exposure offset) relative to the set distance between the first stitch mark 11 and the second stitch mark 12 corresponding in position and located between the two adjacent display panel regions 200.

Due to the fact that the exposure offset between patterning processes performed on the second films of two adjacent display panel regions is obtained according to the offset relative to the set distance between the stitch marks corresponding in position and located between the two adjacent display panel regions, since the distance is relatively small, the exposure offset between the two adjacent display panel regions can be obtained quickly and accurately.

Optionally, as shown in FIG. 7, the first stitch mark 11 and the second stitch mark 12 provided on opposite sides of a same display panel region 200 have a one-to-one correspondence in position. When a plurality of stitch marks are provided on one side of the display panel region 200, there are multiple groups of the first stitch mark 11 and the second stitch mark 12 corresponding in position and located between two adjacent display panel regions 200. The accuracy of the obtained exposure offset between the patterning processes of the two adjacent display panel regions 200 can be improved by measuring the offsets relative to the set distances of the multiple groups of the first stitch mark 11 and the second stitch mark 12 corresponding in position.

Figure 12:
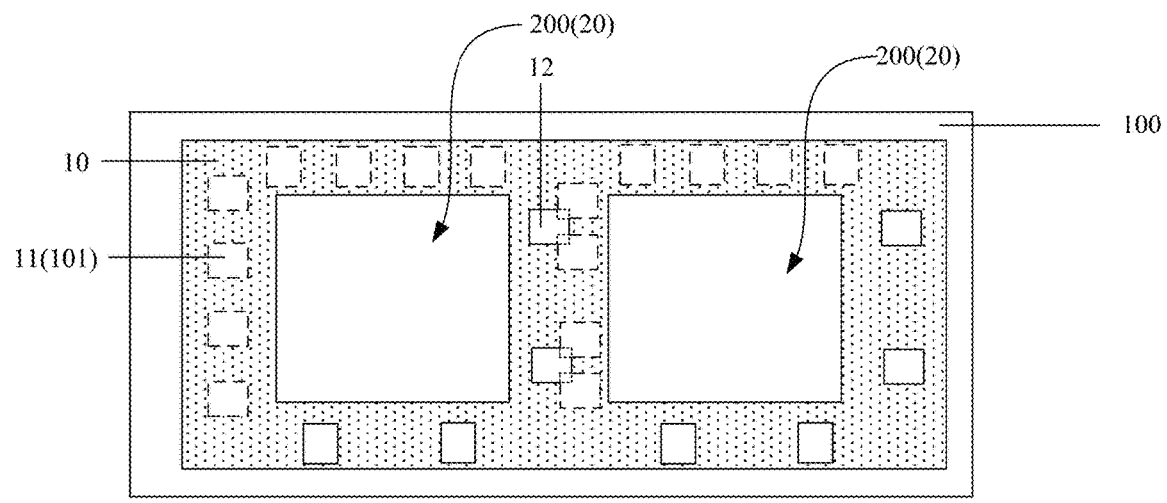

As shown in FIG. 12, a position correspondence between a first stitch mark 11 on one side of the display panel region 200 and two second stitch marks 12 on the opposite side of the display panel region 200 may be set. Thus, two offsets relative to set distances can be obtained from one group of the first stitch mark 11 and the second stitch marks 12 corresponding in position, thereby further improving the accuracy of the obtained exposure offset between the patterning processes of the two adjacent display panel regions 200.

Of course, a combination relationship between the first stitch mark and the second stitch mark corresponding in position and located between two adjacent display panel regions is not limited to the above two types. For example, a position correspondence between one first stitch mark and three second stitch marks may be set, or set distances between a center of one first stitch mark and centers of multiple second stitch marks corresponding in position and located between two adjacent display panel regions are zero, which is not enumerated one by one herein, and falls within the scope of the embodiments of the present disclosure.

Figure 9:
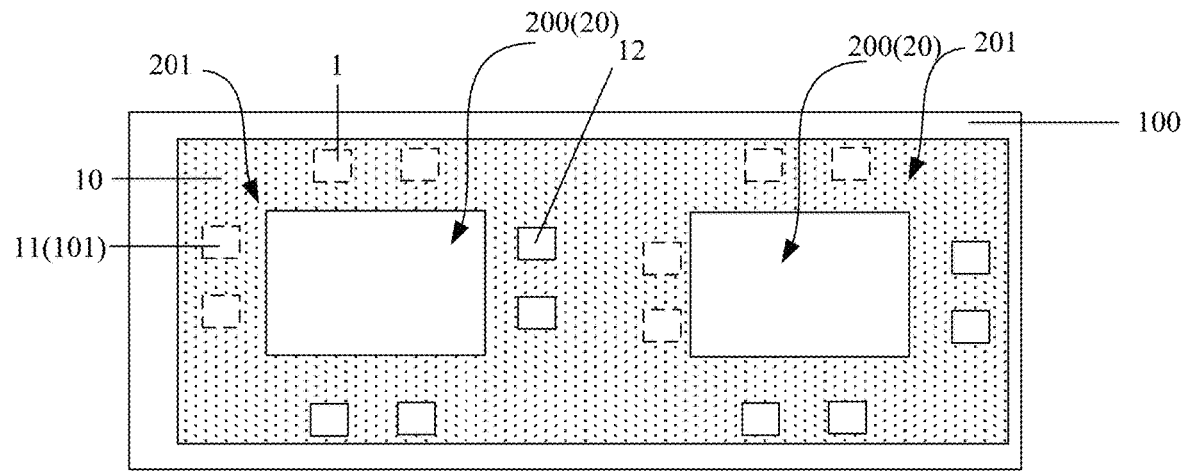
FIG. 9 to FIG. 12 are schematic diagrams illustrating different substrate structures according to embodiments of the present disclosure.
Figure 10:
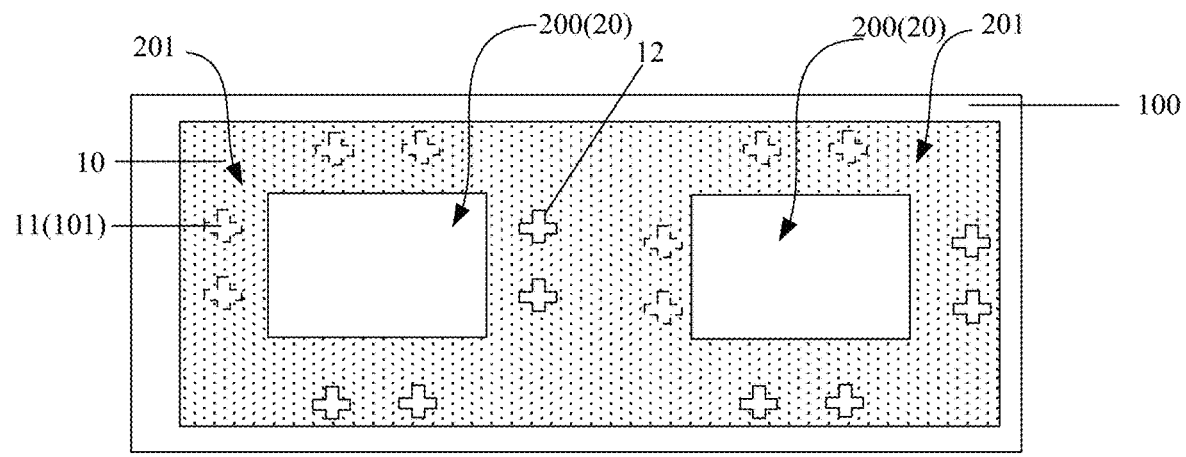
Figure 11:
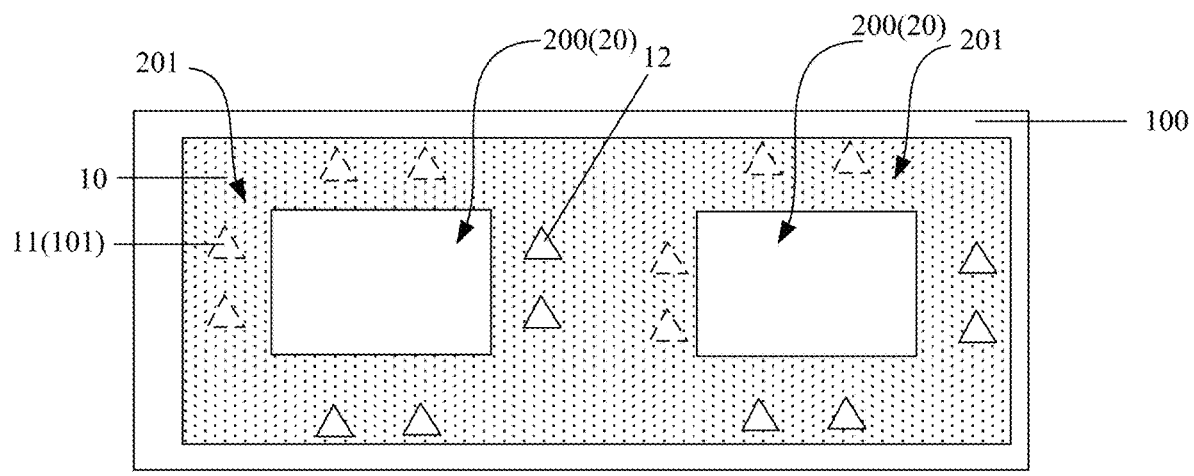

The stitch mark can be a via hole 101 having a regular shape, such as a rectangular hole as shown in FIGS. 7 and 9, a cross-shaped hole as shown in FIG. 10, a triangular hole as shown in FIG. 11. Of course, the stitch mark can also be via holes 101 having other regular shapes, which are not enumerated herein one by one. Or, the stitch mark can also be a via hole 101 having an irregular shape.

As an optional example, the stitch mark is provided as the via hole 101 having a regular shape, to facilitate obtaining the offset relative to the set distance between the first stitch mark 11 and the second stitch mark 12 corresponding in position and located between the two adjacent display panel regions 200.

Figure 8:
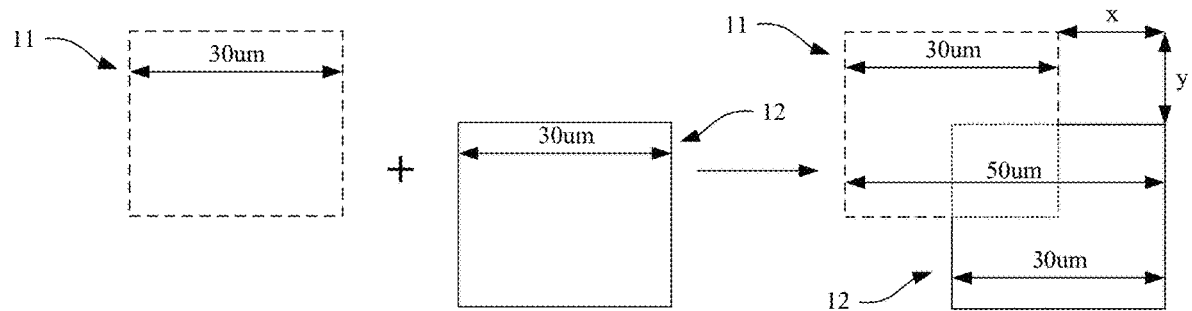
FIG. 8 shows a principle of forming the stitch marks between the two adjacent display panel regions in FIG. 7.

Further, shapes and sizes of all the stitch marks provided on periphery of the display panel region 200 are the same. According to same reference points on the outlines of the stitch marks, the offset between two stitch marks corresponding in position and located between two adjacent display panel regions 200 may be obtained, to further facilitate the acquisition of the offset relative to the set distance between the two stitch marks, as shown in FIG. 7 and FIG. 8.

Figure 6:
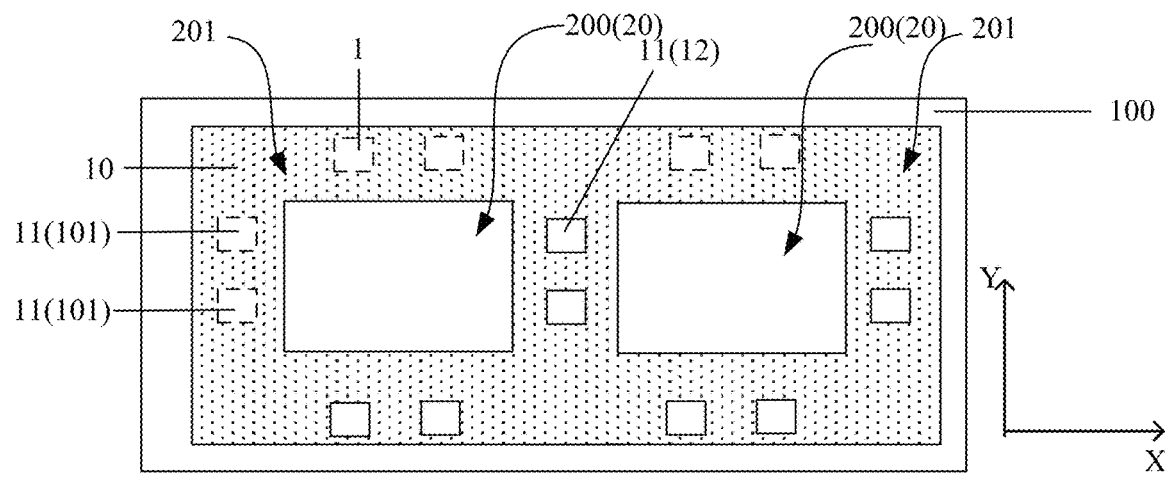
FIG. 6 is a schematic diagram illustrating a substrate structure when there is no exposure offset between two adjacent display panel regions according to embodiments of the present disclosure.

The set distance between the first stitch mark and the second stitch mark corresponding in position and located between two adjacent display panel regions can be arbitrarily set as required, and can be a value larger than zero (when there is no exposure offset, the first stitch mark 11 and the second stitch mark 12 corresponding in position and located between two adjacent display panel regions are spaced), can also be a value smaller than zero (when there is no exposure offset, the first stitch mark 11 and the second stitch mark 12 corresponding in position and located between two adjacent display panel regions overlap partially), or can be equal to zero (when there is no exposure offset, the centers of the first stitch mark 11 and the second stitch mark 12 corresponding in position and located between two adjacent display panel regions 200 coincide with each other, as shown in FIG. 6).

In this embodiment, the set distance is set to zero, and thus it is easier to obtain the offset relative to the set distance between the first stitch mark 11 and the second stitch mark 12 corresponding in position and located between two adjacent display panel regions 200.

As an optional example, as shown in FIG. 7, the shapes and the sizes of all the stitch marks provided on periphery of the display panel region 200 are the same, and the set distance is zero. According to the same reference points on the outlines of the stitch marks, a distance between same reference points on the outlines of the first stitch mark 11 and the second stitch mark 12 corresponding in position and located between two adjacent display panel regions 200, i.e., the offset relative to the set distance, is obtained. For example, when all the stitch marks on periphery of the display panel region 200 are square holes of the same size, a distance between vertices at the same position (for example, upper right vertices as shown in FIG. 7) of the first stitch mark 11 and the second stitch mark 12 corresponding in position and located between two adjacent display panel regions 200 is the offset relative to the set distance.

It should be noted that, the descriptions of the orientation in the embodiment, such as: left, right, up, or down, are defined in terms of the directions in the drawings, which are only for convenience of description, and are by no means limiting.

In a specific implementation, as shown in FIG. 5 and FIG. 7, the first stitch mark 11 and the second stitch mark 12 provided on periphery of the display panel region 200 have a one-to-one correspondence in position, and a first connection line of centers of the first stitch mark 11 and the second stitch mark 12 corresponding in position extends along a first direction, e.g., an X direction as shown in FIG. 7.

The substrate 100 includes two display panel regions 200 adjacent in the first direction, a second connection line of centers of the two display panel regions 200 is parallel to the first connection line (i.e., the two adjacent display panel regions 200 are arranged along the first direction), a distance between the centers of the two display panel regions 200 is equal to a distance between centers of the first stitch mark 11 and the second stitch mark 12 corresponding in position and on opposite sides of a display panel region 200, and the set distance is zero. That is, when there is no exposure offset, the first stitch mark 11 and the second stitch mark 12 corresponding in position and located between the two adjacent display panel regions 200 coincide with each other, as shown in FIG. 6.

As shown in FIG. 7, in case that there is an exposure offset between patterning processes of the two display panel regions 200, since an exposure process is performed on the display panel region 200 and the mark area 201 on periphery of the display panel region 200 by using a same mask, there is also an exposure offset between patterning processes of forming the stitch marks on periphery of the two adjacent display panel regions 200. That is to say, the first stitch mark 11 and the second stitch mark 12 corresponding in position and located between two adjacent display panel regions do not coincide with each other anymore, and are offset from each. The exposure offset between patterning processes of the two display panel regions 200 may be obtained based on a first offset x in the first direction (the X direction as shown in FIG. 7) and a second offset y in a second direction (a Y direction as shown in FIG. 7) perpendicular to the first direction of the first stitch mark 11 and the second stitch mark 12. That is, an offset in the first direction is x, and an offset in the second direction perpendicular to the first direction is y.

In the embodiment, all the stitch marks on periphery of the display panel region 200 are of regular shapes with the same shape and size, which facilitates the acquisition of the offset relative to the set distance between the first stitch mark 11 and the second stitch mark 12 corresponding in position and located between two adjacent display panel regions 200.

As shown in FIG. 7, taking the case that the stitch mark is a square shaped hole for example, and setting a vertex at an upper right corner of the stitch mark as a reference point, the exposure offset between patterning processes of the two display panel regions 200 may be obtained by obtaining the offset relative to the set distance between the vertices at the upper right corners of the first stitch mark 11 and the second stitch mark 12 corresponding in position and located between two adjacent display panel regions 200, and the exposure offset can be broken down into the offset x in the first direction and the offset y in the second direction perpendicular to the first direction.

The first stitch mark and the second stitch mark on opposite sides of a display panel region and corresponding in position can be, but are not limited to, substantially symmetrically distributed with respect to a central axis of the display panel region that is perpendicular to the first connection line.

In the above specific implementation, by providing the stitch marks located on opposite sides of the display panel region and corresponding in position one to one, a plurality of groups of the first stitch mark and the second stitch mark having a one-to-one correspondence in position can be formed between two adjacent display panel regions, to facilitate the acquisition of the offset relative to the set distance between the first stitch mark and the second stitch mark corresponding in position. Moreover, the accuracy can be improved by providing the plurality of groups of the first stitch mark and the second stitch mark having a one-to-one correspondence in position.

In the above specific implementation, two adjacent display panel regions are arranged along the first direction. As for the case that two adjacent display panel regions are arranged along the second direction perpendicular to the first direction, the corresponding technical solutions are the same as above specific implementation. When the substrate includes at least four display panel regions distributed in a substantially matrix along the first direction and the second direction, the corresponding technical solutions are a combination of the above two cases, which is not described in detail herein.

In order to simplify the manufacturing process, the first film 10 used for manufacturing the stitch marks and the second film 20 of the display panel region 200 can be a same film in the embodiment, and can be manufactured simultaneously in one film forming process by using a same material.

For example, when the display substrate motherboard in the embodiment is an organic electroluminescence display substrate motherboard, the display panel region of the organic electroluminescence display substrate motherboard includes various functional film layers of an organic electroluminescent diode, a pixel definition layer, a planarization layer, etc.

The second film 20 in the embodiment can be the planarization layer or the pixel definition layer of the organic electroluminescence display substrate motherboard. The first film 10 used for manufacturing the stitch marks and the planarization layer or the pixel definition layer can be manufactured simultaneously in one film forming process by using a same material. Since the planarization layer are the pixel definition layer are thick, a planar surface can be provided, so that open ends of the via holes 101 are located in a same plane, which is beneficial to accurately obtain the exposure offset.

Similarly, when the display substrate motherboard in the embodiment is a liquid crystal display substrate motherboard, the display panel region of the liquid crystal display substrate motherboard includes various functional film layers of a thin film transistor, a planarization layer, a pixel electrode, etc.

The second film 20 in the embodiment may be the planarization layer of the liquid crystal display substrate motherboard. The first film 10 used for manufacturing the stitch marks and the planarization layer may be manufactured simultaneously in one film forming process by using a same material. Since the planarization layer is thick, a planar surface can be provided, so that open ends of the via holes 101 are located in a same plane, which is beneficial to accurately obtain the exposure offset.

Taking the case that the display substrate motherboard is the organic electroluminescence display substrate motherboard for example, in this embodiment, a method for manufacturing stitch marks of the display substrate motherboard specifically includes the following steps.

First, a planarization layer 10 is deposited on the substrate 100. The planarization layer 10 is made of a positive photoresist. One display panel region 200 and the planarization layer 10 of a mark area on periphery of the display panel region 200 are simultaneously exposed in one patterning process by using a mask, and then developed to form the first stitch marks 11 and the second stitch marks 12 on opposite sides of the display panel region 200 on the planarization layer 10 of the mark area. The first stitch marks 11 and the second stitch marks 12 are via holes 101 in the planarization layer 10, as shown in FIG. 5.

Then, Another display panel region 200 and the planarization layer 10 of a mark area on periphery of the display panel region 200 are simultaneously exposed in one patterning process by using the same mask, and then developed to form the first stitch marks 11 and the second stitch marks 12 on opposite sides of the display panel region 200 on the planarization layer 10 of the mark area, as shown in FIG. 7. There is an offset between the exposures of the two adjacent display panel regions 200, thus there is an offset relative to a set distance between the first stitch mark 11 and the second stitch mark 12 corresponding in position and located between the two adjacent display panel regions 200, the set distance is zero. Therefore, when there is no exposure offset, the first stitch mark 11 and the second stitch mark 12 corresponding in position and located between two adjacent display panel regions coincide with each other, as shown in FIG. 6. When there is an exposure offset, a first offset x=20 um in a first direction and a second offset y=20 um in a second direction perpendicular to the first direction between the first stitch mark 11 and the second stitch mark 12 corresponding in position and located between two adjacent display panel regions are the exposure offset between the two adjacent display panel regions 200, as shown in FIG. 8.

At this point, the manufacture of the stitch marks is completed. As for the method for manufacturing other functional film layer patterns of the organic electroluminescence display substrate motherboard, a detailed description is omitted herein.

In the above embodiments, the stitch marks used to obtain the offset between two successive exposure processes of two adjacent display panel regions are taken as an example to specifically describe the technical solution of the present disclosure.

The stitch marks in the embodiments of the present disclosure can also be alignment stitch marks, and alignment is performed on a mask and a display panel region by using the alignment stitch marks, to perform a patterning process on the display panel region. Specifically, the performing the patterning process on the second film 20 to form the pattern of the second film 20 includes: when the second film 20 in at least one display panel region 200 of the substrate is to be patterned, performing alignment on the mask and the display panel region 200 by using the stitch marks 11 and 12, and patterning the second film 20 by using the mask.

Of course, the stitch marks of the present disclosure may also be stitch marks having other functions.

The above are merely some embodiments of the present disclosure, it should be noted that for those of ordinary skill in the art, various modifications and improvements may be made without departing from the principle of the present disclosure, and these modifications and improvements shall be deemed as falling within the scope of the present disclosure.

What is claimed is:

1. A method for manufacturing a display substrate motherboard comprising a substrate, the substrate comprising at least two display panel regions, and a mark area being provided on periphery of each of the display panel regions, the method comprising:
    forming a first film in the mark area; and
    performing a patterning process on the first film to form a plurality of stitch marks,
    wherein the plurality of stitch marks are via holes formed in the first film.

2. The method according to claim 1, further comprising:
    forming a second film in each of the display panel regions of the substrate; and
    performing a patterning process on the second film to form a pattern of the second film.

3. The method according to claim 2, wherein the performing the patterning process on the first film and performing the patterning process on the second film comprise:
    sequentially patterning second films in all the display panel regions and first films in corresponding mark areas by using a mask, wherein the second film in each of the display panel regions and the first film in the corresponding mark area are patterned simultaneously in one patterning process by using the mask, to form the pattern of the second film and the plurality of stitch marks on the first film;
    wherein, the plurality of formed stitch marks comprise: at least one first stitch mark on one side of the display panel region and at least one second stitch mark on an opposite side of the display panel region, a mark area between two adjacent display panel regions is provided with the first stitch mark and the second stitch mark, so as to obtain an exposure offset between patterning processes performed on the second films of the two adjacent display panel regions based on an offset relative to a set distance between the first stitch mark and the second stitch mark corresponding in position and in the mark area between the two adjacent display panel regions.

4. The method according to claim 2, wherein the display substrate motherboard is an organic electroluminescence display substrate motherboard;
the performing the patterning process on the second film to form the pattern of the second film comprises:
patterning the second film to form a planarization layer or a pixel definition layer of the organic electroluminescence display substrate motherboard.

5. The method according to claim 2, wherein the display substrate motherboard is a liquid crystal display substrate motherboard;
the performing the patterning process on the second film to form the pattern of the second film comprises:
patterning the second film to form a planarization layer of the liquid crystal display substrate mother board.

6. The method according to claim 2, wherein the first film and the second film are made of a photoresist.

7. The method according to claim 2, wherein the performing the patterning process on the second film to form the pattern of the second film comprises:
when the second film in at least one display panel region of the substrate is to be patterned, aligning a mask with the display panel region by using the stitch marks, and patterning the second film by using the mask.

8. A display substrate motherboard, comprising:
a substrate, comprising at least two display panel regions, wherein a mark area is provided on periphery of each of the display panel regions; and
a first film in the mark area, wherein the first film comprises a plurality of stitch marks, and the plurality of stitch marks are via holes formed in the first film.

9. The display substrate motherboard according to claim 8, further comprising:
a second film disposed on the substrate, wherein the second film is in each of the display panel regions.

10. The display substrate motherboard according to claim 9, wherein the plurality of stitch marks comprise at least one first stitch mark on one side of each of the display panel regions and at least one second stitch mark on an opposite side of each of the display panel regions, the first stitch mark and the second stitch mark are provided between two adjacent display panel regions, so as to obtain an exposure offset between patterning processes performed on the second films of the two adjacent display panel regions based on an offset relative to a set distance between the first stitch mark and the second stitch mark corresponding in position and between the two adjacent display panel regions.

11. The display substrate motherboard according to claim 10, wherein orthographic projection lines, on one side of the substrate, of the first stitch mark and the second stitch mark corresponding in position on periphery of the display panel region at least partially overlap, and a first connection line of centers of the first stitch mark and the second stitch mark corresponding in position extends substantially along a first direction; and
the substrate comprises two display panel regions adjacent in the first direction, a second connection line of centers of the two display panel regions is parallel to the first connection line, a distance between the centers of the two display panel regions is substantially equal to a distance between centers of the first stitch mark and the second stitch mark corresponding in position and on opposite sides of a display panel region, and the set distance is zero.

12. The display substrate motherboard according to claim 11, wherein the first stitch mark and the second stitch mark corresponding in position and on opposite sides of the display panel region are substantially symmetrically distributed with respect to a central axis of the display panel region that is perpendicular to the first connection line.

13. The display substrate motherboard according to claim 12, wherein a shape and an aperture size of the first stitch mark are substantially the same as a shape and an aperture size of the second stitch mark.

14. The display substrate motherboard according to claim 12, wherein the substrate comprises at least four display panel regions, and the at least four display panel regions are distributed substantially in matrix.

15. The display substrate motherboard according to claim 9, wherein the display substrate motherboard is an organic electroluminescence display substrate motherboard; and
the second film is a planarization layer or a pixel definition layer of the organic electroluminescence display substrate motherboard.

16. The display substrate motherboard according to claim 9, wherein the display substrate motherboard is a liquid crystal display substrate motherboard; and
the second film is a planarization layer of the liquid crystal display substrate motherboard.

17. The display substrate motherboard according to claim 8, wherein the stitch marks are regular-shaped via holes.

18. The display substrate motherboard according to claim 8, wherein the stitch marks are irregular-shaped via holes.

19. A method for obtaining an exposure offset in a process of manufacturing the display substrate motherboard according to claim 3, comprising:
obtaining the exposure offset between patterning processes performed on the second films of the two adjacent display panel regions based on the offset relative to the set distance between the first stitch mark and the second stitch mark corresponding in position and in the mark area between the two adjacent display panel regions.

* * * * *